(12) United States Patent
Lee et al.

(10) Patent No.: US 11,139,184 B2
(45) Date of Patent: Oct. 5, 2021

(54) METHOD AND APPARATUS FOR TREATING SUBSTRATE

(71) Applicant: SEMES CO., LTD., Chungcheongnam-do (KR)

(72) Inventors: Ki Seung Lee, Cheonan-si (KR); Soo Hyun Cho, Cheonan-si (KR); Choongki Min, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 474 days.

(21) Appl. No.: 16/158,950

(22) Filed: Oct. 12, 2018

(65) Prior Publication Data

US 2019/0115231 A1 Apr. 18, 2019

(30) Foreign Application Priority Data

Oct. 17, 2017 (KR) ........................ 10-2017-0134431

(51) Int. Cl.
*H01L 21/67* (2006.01)
*H01L 21/687* (2006.01)
(Continued)

(52) U.S. Cl.
CPC .... *H01L 21/67109* (2013.01); *H01L 21/0273* (2013.01); *H01L 21/6715* (2013.01);
(Continued)

(58) Field of Classification Search
CPC ........... H01L 21/0273; H01L 21/48764; H01L 21/67023; H01L 21/67098;
(Continued)

(56) References Cited

U.S. PATENT DOCUMENTS 5,980,195 A * 11/1999 Miyashita ........... H01L 21/6732
414/783
8,845,810 B2 * 9/2014 Hwang ............. H01L 21/68742
118/729
(Continued)

FOREIGN PATENT DOCUMENTS

KR 10-0735742 B1 7/2007
KR 10-0822372 B1 4/2008
(Continued)

*Primary Examiner* — Steven B McAllister
*Assistant Examiner* — Benjamin W Johnson
(74) *Attorney, Agent, or Firm* — Li & Cai Intellectual Property (USA) Office (57) ABSTRACT

The inventive concept provides an apparatus and a method for heat-treating a substrate. The method includes a first treatment operation of spacing a substrate apart from a support plate provided with a heater to a first height in a state in which a treatment space, in which the substrate is treated, is closed and heating the substrate, a second treatment operation of, after the first treatment operation, lowering the substrate such that the substrate is located at a second height and heating the substrate, a third treatment operation of, after the second treatment operation, lifting the substrate such that the substrate is spaced apart from the support plate to be located at a third height and heating the substrate, and a fourth treatment operation of, after the third treatment operation, lowering the substrate such that the substrate is located at a fourth height and heating the substrate.

15 Claims, 7 Drawing Sheets

(51) Int. Cl.
  *H01L 21/027* (2006.01)
  *F24C 15/10* (2006.01)
(52) U.S. Cl.
  CPC .... *H01L 21/6719* (2013.01); *H01L 21/67023* (2013.01); *H01L 21/67126* (2013.01); *H01L 21/68742* (2013.01); *F24C 15/105* (2013.01)
(58) Field of Classification Search
  CPC ......... H01L 21/67109; H01L 21/67126; H01L 21/6715; H01L 21/6719; H01L 21/6875; H01L 21/67309; H01L 21/68742; H01L 21/324; H01L 21/67103; F24C 15/105
  USPC ....................................................... 432/258
  See application file for complete search history.

(56) References Cited

U.S. PATENT DOCUMENTS

2010/0273333 A1* 10/2010 Kato .................. H01L 21/2686
                                                        438/795
2017/0040204 A1*  2/2017 Kim ................. H01L 21/67754
2017/0162409 A1*  6/2017 Toyomura ........... H01L 21/6838

FOREIGN PATENT DOCUMENTS

| KR | 100822372 B1 * | 4/2008 |
| KR | 10-1099549 B1 | 12/2011 |
| KR | 10-1776018 B1 | 9/2017 |

* cited by examiner

METHOD AND APPARATUS FOR TREATING SUBSTRATE

CROSS-REFERENCE TO RELATED APPLICATIONS

This application claims priority under 35 U.S.C. § 119 to Korean Patent Application No. 10-2017-0134431 filed on Oct. 17, 2017, in the Korean Intellectual Property Office, the disclosures of which are incorporated by reference herein in their entireties.

BACKGROUND

Embodiments of the inventive concept described herein relate to a method and an apparatus for heat-treating a substrate.

Various processes such as cleaning, deposition, photographing, etching, and ion implantation are performed to manufacture a semiconductor device. Among the processes, an application process is used as a process of forming a liquid film on a substrate. In general, an application process is a process of forming a liquid film by applying a treatment liquid onto a substrate.

A baking process of baking a substrate is performed before and after a liquid film is formed on the substrate. The baking process is a process of heating a substrate to a process temperature or higher in a closed space, and stabilizes a liquid film by scattering an organic material on the liquid film. In the baking process, an entire area of the substrate has to be heated at a uniform temperature according to the operations.

However, in the space in which the substrate is treated, an area in which air currents are introduced and an area in which air currents are discharged are different, and the temperatures of the substrate for the area that is adjacent to the introduction area and the area that is adjacent to the discharge area are different. Accordingly, a liquid film is unevenly heated for the areas, and accordingly, the thicknesses of the liquid film are different for the areas.

SUMMARY

Embodiments of the inventive concept provide an apparatus and a method for uniformly baking an entire area of a substrate.

Embodiments of the inventive concept also provide an apparatus and a method for uniformly adjusting the thickness of a liquid film formed on a substrate.

The technical objects of the inventive concept are not limited to the above-mentioned ones, and the other unmentioned technical objects will become apparent to those skilled in the art from the following description.

The inventive concept provides an apparatus and a method for heat-treating a substrate. The method includes a first treatment operation of spacing a substrate apart from a support plate provided with a heater to a first height in a state in which a treatment space, in which the substrate is treated, is closed and heating the substrate, a second treatment operation of, after the first treatment operation, lowering the substrate such that the substrate is located at a second height and heating the substrate, a third treatment operation of, after the second treatment operation, lifting the substrate such that the substrate is spaced apart from the support plate to be located at a third height and heating the substrate, and a fourth treatment operation of, after the third treatment operation, lowering the substrate such that the substrate is located at a fourth height and heating the substrate.

The second height and the fourth height may be locations at which the substrate is positioned on the support plate. The first height and the third height may be the same height.

The first treatment operation may be performed for a first time period, the second treatment operation may be performed for a second time period, the third treatment operation may be performed for a third time period, the fourth treatment operation may be performed for a fourth time period, and the second time period and the third time period may be shorter than the first time period or the fourth time period. The second time period may be shorter than the third time period. The fourth time period may be longer than the first time period.

The treating of the substrate may include a baking process of heating the substrate, to which a photosensitive liquid is applied.

The treatment space may be provided with a guide plate located above the support plate to face the support plate and configured to guide air currents in the treatment space, and the height of the guide plate may be different in at least two of the first treatment operation, the second treatment operation, the third treatment operation, and the fourth treatment operation. The guide plate may be lowered when the substrate is lifted and may be lifted when the substrate is lowered.

A substrate treating apparatus includes a chamber having a treatment space in the interior thereof, a support plate located in the treatment space and an upper surface of which is provided as a support surface that supports the substrate, a heater provided in the support plate and configured to heat the substrate, a lift pin being movable between a lowering location at which an upper end of the lift pin is located below the support surface and a lifting location at which the upper end of the lift pin protrudes through the upper side of the support surface, and a controller configured to control the lift pin, and the controller may control the lift pin to sequentially perform a first treatment operation of heating the substrate at a first height by which the substrate is spaced apart from the support plate, a second treatment operation of lowering the substrate such that the substrate is located at a second height and heating the substrate, a third treatment operation of lifting the substrate to a third height at which the substrate is spaced apart from the support plate and heating the substrate, and a fourth treatment operation of lowering the substrate such that the substrate is located at a fourth height and heating the substrate.

The second height and the fourth height may be locations at which the substrate is positioned on the support plate, and the first height and the third height may be the same height.

The first treatment operation may be performed for a first time period, the second treatment operation may be performed for a second time period, the third treatment operation may be performed for a third time period, the fourth treatment operation may be performed for a fourth time period, and the second time period and the third time period may be shorter than the first time period or the fourth time period. The second time period may be shorter than the third time period.

The substrate treating apparatus may further include a guide plate located above the support plate to face the support plate in the treatment space and configured to guide air currents in the treatment space, and the controller may control the guide plate such that the height of the guide plate is different in at least two of the first treatment operation, the second treatment operation, the third treatment operation, and the fourth treatment operation. The controller may lower the guide plate when the substrate is lifted and may lift the guide plate when the substrate is lowered.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

Hereinafter, exemplary embodiments of the inventive concept will be described with reference to FIGS. 1 to 9.

Figure 1:
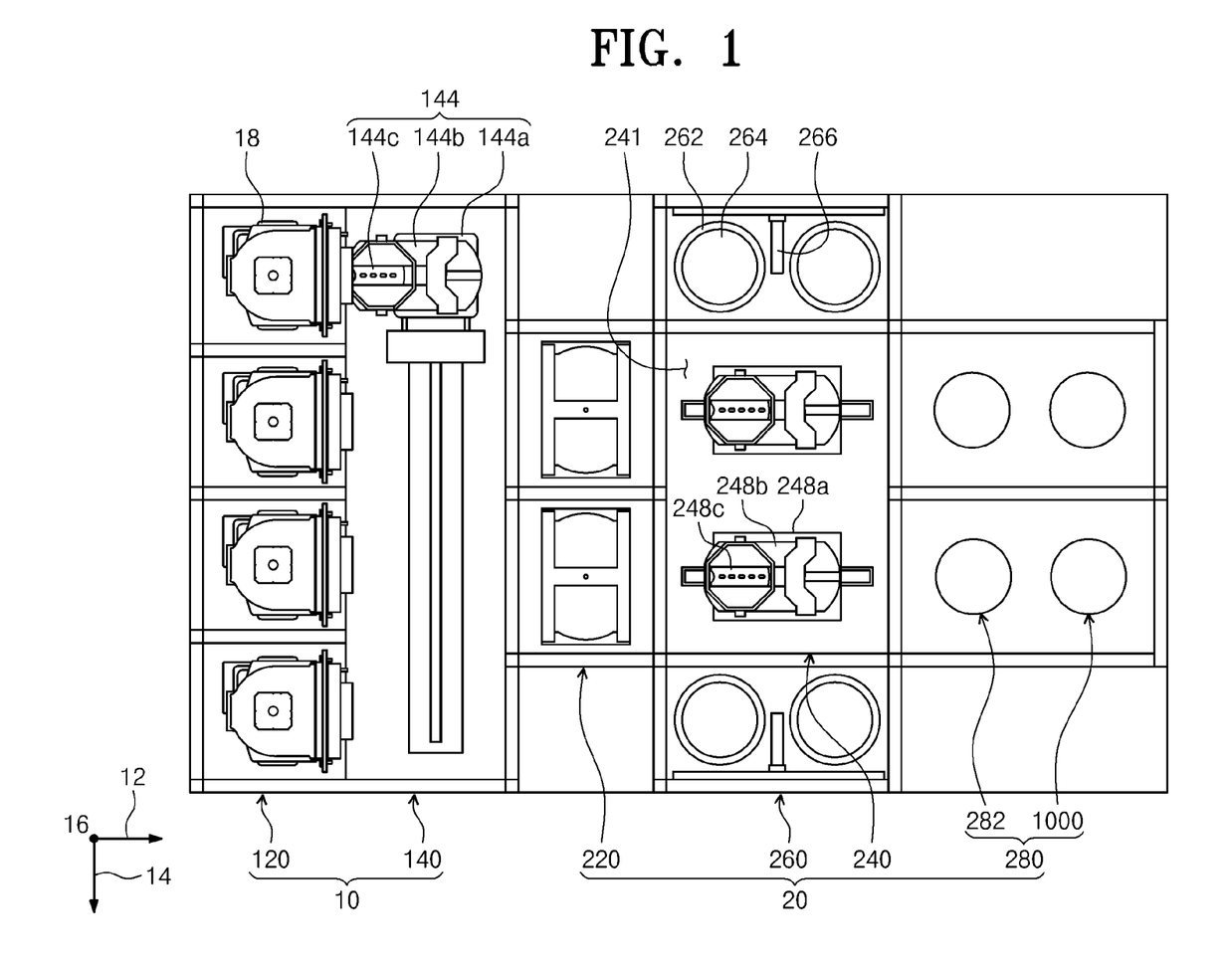
FIG. 1 is a plan view illustrating a substrate treating system according to an embodiment of the inventive concept.
Figure 2:
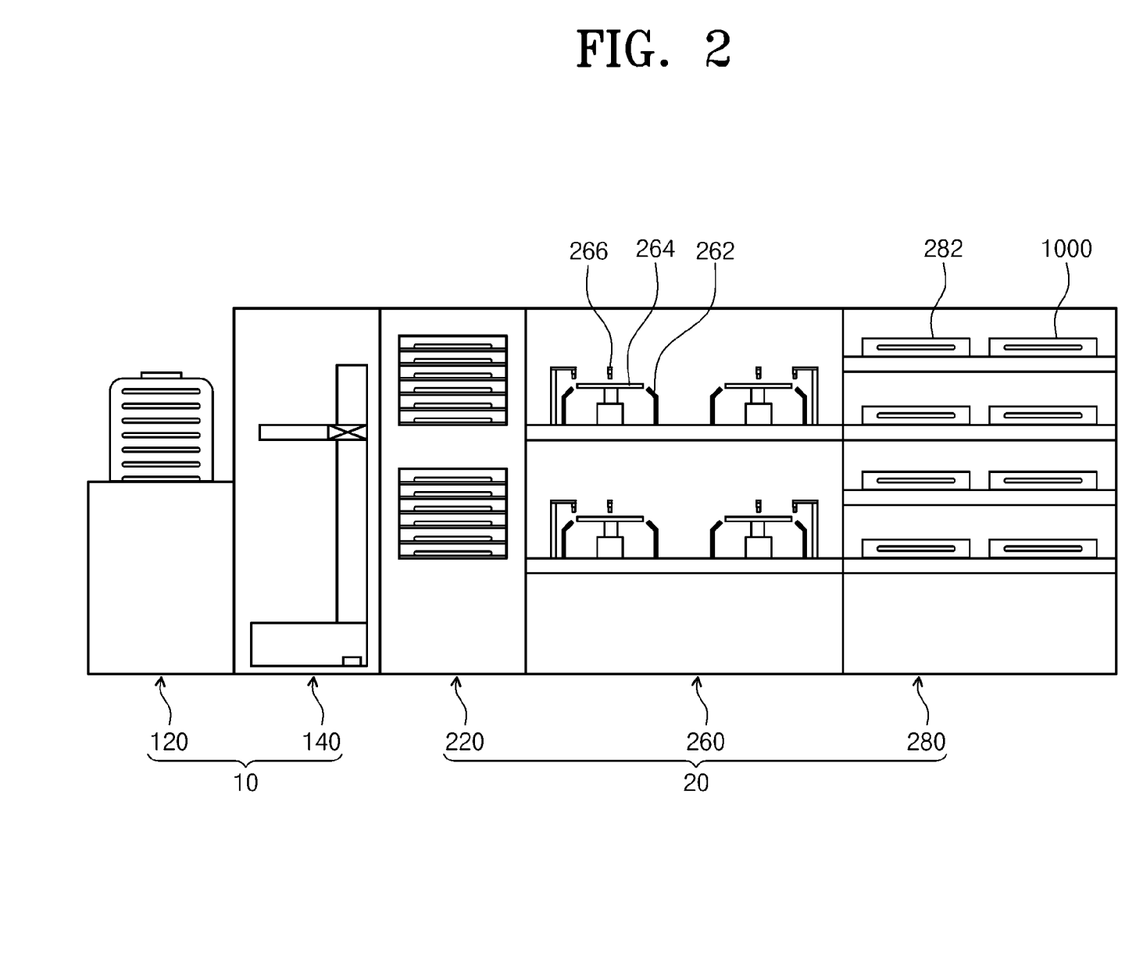
FIG. 2 is a sectional view illustrating the substrate treating system of FIG. 1.

FIG. 1 is a plan view illustrating a substrate treating system according to an embodiment of the inventive concept. FIG. 2 is a sectional view illustrating the substrate treating system of FIG. 1. Referring to FIGS. 1 to 2, the substrate treating system 1 includes an index module 10 and a process executing module 20. The index module 10 includes a plurality of load ports 120 and a feeding frame 140. The load ports 120, the feeding frame 140, and the process executing module 20 may be sequentially arranged in a row. Hereinafter, a direction in which the load ports 120, the feeding frame 140, and the process executing module 20 are arranged will be referred to as a first direction 12, a direction that is perpendicular to the first direction 12 when viewed from the top will be referred to as a second direction 14, and a direction that is perpendicular to the first direction 12 and the second direction 14 will be referred to as a third direction 16.

A carrier 18, in which a substrate W is received, is seated on the load port 120. A plurality of load ports 120 are provided, and are arranged along the second direction 14 in a row. However, the number of the load ports 120 may increase or decrease according to a condition, such as the process efficiency of the process executing module 20 or a footprint. A plurality of slots (not illustrated) for receiving substrates W while the substrates W are arranged in parallel to the ground surface are formed in the carrier 18. A front opening unified pod (FOUP) may be used as the carrier 18.

The process executing module 20 includes a buffer unit 220, a transportation unit 240, an application unit 260, and a baking unit 280. Here, the application unit 260 and the baking unit 280 are provided as substrate treating units 260 and 280 that treat a substrate W. The application unit 260 is provided as a liquid treating unit 260 that liquid-treats the substrate W, and the baking unit 280 is provided as a heat treating unit 280 that heat-treats the substrate W. Application units 260 are disposed on opposite sides of the transportation unit 240, respectively. That is, the application units 260 are arranged in the second direction 14, and are located to be symmetrical to each other with respect to the transportation unit 240. Some of the application units 260 are disposed along the first direction 12. Furthermore, some of the application units 260 are disposed to be stacked on each other. That is, the application units 260 having an array of A by B may be disposed on one side of the transportation unit 240. Here, A is the number of the application units 260 provided in a row along the first direction 12, and B is the number of the application units 260 provided in a row along the third direction 16. When four or six application units 260 are provided on one side of the transportation unit 240, the application units 260 may be disposed in an array of 2 by 2 or 3 by 2. The number of the application units 260 may increase or decrease.

Selectively, the application units 260 may be provided only on one side of the transportation unit 240. Further, the application units 260 may be provided on one side or opposite sides of the transportation unit 240 to form a single layer.

The buffer unit 220 is disposed between the feeding frame 140 and the transportation unit 240. A plurality of buffer units 220 are provided, and are disposed along the second direction 14 in a row. Each of the buffer units 220 provides a space in which a substrate W stays before being transported, between the transportation unit 240 and the feeding frame 140. A plurality of slots (not illustrated) in which the substrates W are positioned are provided in the interior of the buffer unit 220. A plurality of slots (not illustrated) may be provided to be spaced apart from each other along the third direction 16. A surface of the buffer unit 220 that faces the feeding frame 140 and a surface of the buffer unit 220 that faces the transportation unit 240 are opened.

The feeding frame 140 transports the substrates W between the carrier 18 seated on the load port 120 and the buffer unit 220. An index rail 142 and an index robot 144 are provided in the feeding frame 140. The index rail 142 is configured such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is configured to be moved along the third direction 16 on the base 144a. The body 144b is configured to be rotated on the base 144a. The index arms 144c are coupled to the body 144b, and are configured to be moved forwards and rearwards with respect to the body 144b. A plurality of index arms 144c are configured to be driven individually. The index arms 144c are arranged to be stacked so as to be spaced apart from each other along the third direction 16. Some of the index arms 144c are used when the substrates W are transported to the carrier 18 in the process execution module 20, and some of the index arms 144c may be used when the substrates W are transported from the carrier 18 to the process executing module 20. This structure may prevent particles generated from the substrates W before the process treatment from being attached to the substrates W after the process treatment in the process of carrying the substrates W in and out by the index robot 144.

The transportation unit 240 transports the substrate W between any two of the buffer unit 220, the application unit 260, and the baking unit 280. The transportation unit 240 is located between the buffer unit 220 and the baking unit 280 arranged in the first direction 12 and is located between the application units 260 arranged in the second direction 14.

The transportation unit 240 includes a transportation chamber 244 and a plurality of transportation members 244. The transportation chamber 242 provides a transportation space 241 in the interior thereof. When viewed from the top, the transportation chamber 242 is located to be surrounded by the buffer unit 220, the application unit 260, and the baking unit 280. For example, the transportation chamber 242 may have a rectangular parallelepiped shape. One side wall of the transportation chamber 242 that faces the first direction 12 may face the baking unit 280, and an opposite side wall of the transportation chamber 242 that is opposite to the one side wall may face the buffer unit 220. Further, the opposite side walls of the transportation chamber 242 that face the second direction 14 may face the application unit 260.

The transportation members 244 are located in the transportation space 241. Some (hereinafter, the one transportation member) of the plurality of transportation members 244 are located on one side of the first direction 12, and others (hereinafter, the other transportation member) are located on an opposite side of the first direction 12. The one transportation member 244a transports the substrate W between any two of the buffer unit 220, the application unit 260, and the baking unit 280 located on one side of the first direction 12. The other transportation member 244b transports the substrate W between any two of the buffer unit 220, the application unit 260, and the baking unit 280 located on an opposite side of the first direction 12.

Each of the one transportation member 244a and the other transportation member 244b includes a transportation rail 246 and a transportation robot 244. The transportation rail 246 is disposed such that the lengthwise direction thereof faces the third direction 16. The transportation robot 244 is installed on the transportation rail 246, and is linearly moved along the third direction 16 on the transportation rail 246. The transportation robot 244 has a base 248a, a body 248b, and a plurality of transportation arms 248c. The base 248a is installed in the transportation rail 246. The base 248a may be linearly moved along the lengthwise direction of the transportation rail 246. The body 248b is coupled to the base 248a. The body 248b is provided to be rotated about the third direction 16 on the base 248a. The transportation arms 248c are coupled to the body 248b, and are configured to be moved forwards and rearwards with respect to the body 248b. A plurality of transportation arms 248c are provided to be driven individually. The transportation arms 248c are disposed to be spaced apart from each other along the third direction 16.

The application units 260 have the same structure. Meanwhile, the kinds of the treatment liquids used by the application units 260 may be different. The application unit 260 applies a treatment liquid onto the substrate W. The application unit 260 has a treatment container 262, a substrate support member 264, and a nozzle 266. The treatment container 262 has an open-topped cup shape. The substrate support member 264 is located in the treatment container 262, and supports the substrate W. The substrate support member 264 may be provided to be rotatable. The nozzle 266 supplies a treatment liquid onto the substrate W positioned on the substrate support member 264. The nozzle 266 may supply the treatment liquid to the center of the substrate W. As an example, the treatment liquid may be provided as a photosensitive liquid that forms a photosensitive liquid film on the substrate. Further, the treatment liquid may be provided as a liquid that forms a hard mask on the substrate.

Further, additionally, the application unit 260 may be further provided with a nozzle that supplies a wetting liquid, such as thinner, for making a surface of the substrate W hydrophobic before the treatment liquid is supplied.

The baking unit 280 heat-treats the substrate W. For example, the baking unit 280 performs a prebaking process of eliminating organic substances and moisture on the surface of the substrate W by heating the substrate W at a predetermined temperature before a treatment liquid is applied or a soft baking process performed after a treatment liquid is applied onto the substrate W. The baking process includes a heating process of heating the substrate W and a cooling process of cooling the substrate W. A plurality of baking units 280 are provided, and are arranged along the second direction 14 in a row. Some of the baking units 280 are located on one side of the first direction 12, and the others of the baking units 280 are located on an opposite side of the first direction 12. The baking units 280 located on the one side heat-treat the substrate W that has been applied by the application unit 260 located on one side of the transportation unit 240. The baking units 280 located on the opposite side heat-treat the substrate W that has been applied by the application unit 260 located on an opposite side of the transportation unit 240.

The baking unit 280 includes a cooling plate 282 that performs a cooling process and a heating unit 1000 that performs a heating process. The cooling plate 282 cools the substrate W heated by the heating unit 1000. The cooling plate 282 is provided to have a circular plate shape. Cooling water or a cooling unit, such as a thermoelectric element, is provided in the interior of the cooling plate 282. For example, the substrate W positioned on the cooling plate 282 may be may be cooled to a room temperature or a temperature that is close to the room temperature.

Figure 3:
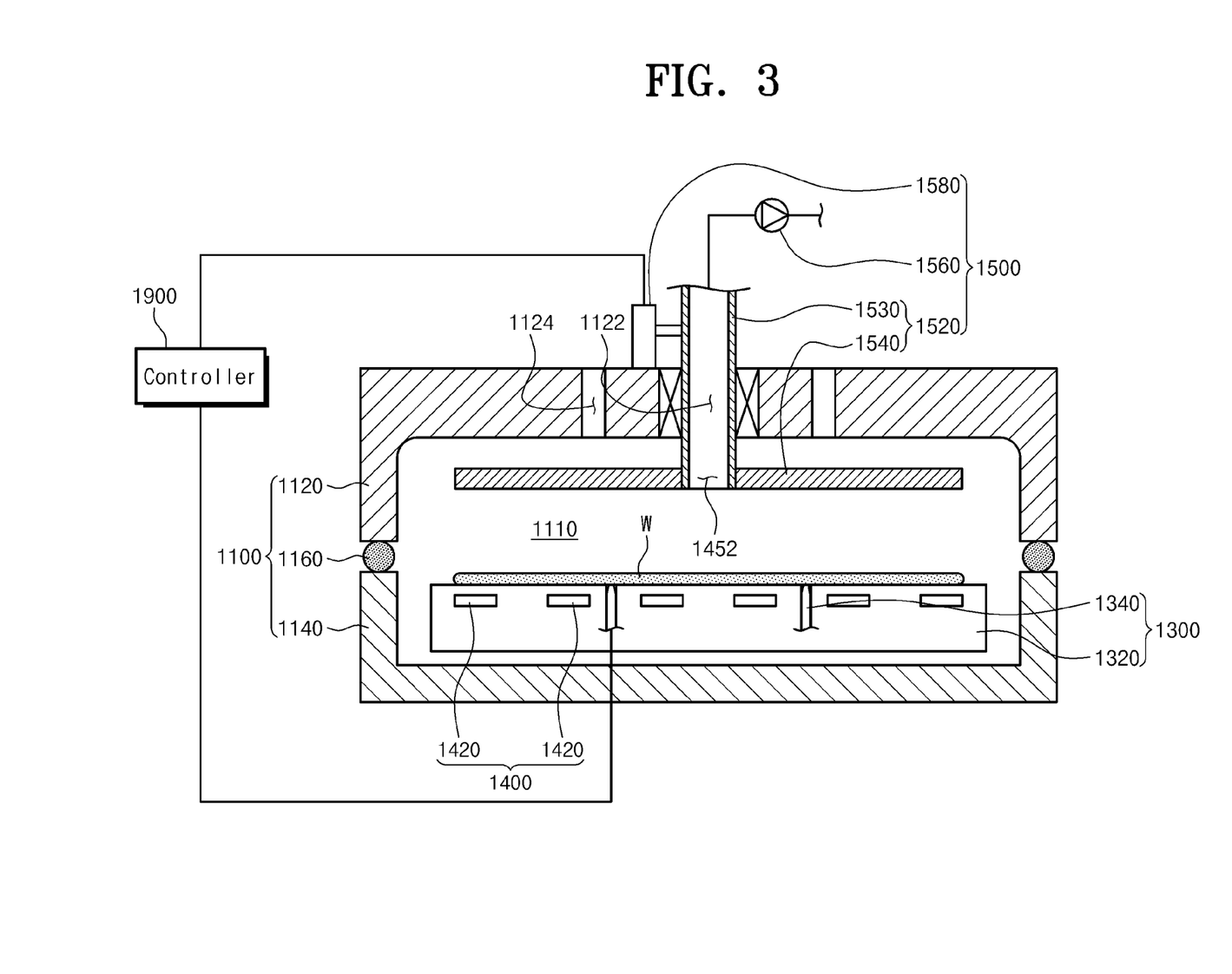
FIG. 3 is a sectional view illustrating a substrate treating apparatus of FIG. 1.

The heating unit 1000 heats the substrate W at a normal pressure or a temperature that is close to the normal pressure. The heating unit 1000 may provide the substrate W as the substrate treating apparatus 1000 that heats the substrate W. FIG. 3 is a sectional view illustrating the substrate treating apparatus of FIG. 1. Referring to FIG. 3, the substrate treating apparatus 1000 includes a chamber 1100, a substrate support unit 1200, a heating member 1400, a guide unit, and a controller 1900.

The chamber 1100 has a treatment space 1110, in which the substrate W is heated, in the interior thereof. The treatment space 1110 is a space that is blocked from the outside. The chamber 1100 includes an upper body 1120, a lower body 1140, and a sealing member 1160.

The upper body 1120 has a bottom-topped vessel shape. A central hole 1122 and a peripheral hole 1124 are formed on an upper surface of the upper body 1120. The central hole 1122 is formed at the center of the upper body 1120. The central hole 1122 functions as an exhaustion hole 1122, through which an atmosphere of the treatment space 1110 is exhausted. A plurality of peripheral holes 1124 are provided, and are formed at locations that deviate from the center of the upper body 1120. The peripheral holes 1124 function as introduction holes 1124, through which exterior currents are introduced into the treatment space 1110. The peripheral holes 1124 are located to surround the central holes 1124. The peripheral holes 1124 are located to be spaced apart from each other along a circumferential direction. According to an example, four peripheral holes 1124 may be provided. The exterior currents may be air.

Selectively, three or five peripheral holes 1124 may be provided. Further, the exterior currents may be an inert gas.

The upper body 1140 has an open-topped vessel shape. The lower body 1140 is located below the upper body 1120. The upper body 1120 and the lower body 1140 are located to face each other vertically. The upper body 1120 and the lower body 1140 are combined with each other to form a treatment space therebetween. The upper body 1120 and the lower body 1140 are located such that the central axes of the upper body 1120 and the lower body 1140 coincide with each other with respect to a vertical direction. The lower body 1140 may have the same diameter as that of the upper body 1120. That is, an upper end of the lower body 1140 may be located to be opposite to a lower end of the upper body 1120.

One of the upper body 1120 and the lower body 1140 is moved to an opening location and an interruption location by an elevation member 1130, and the location of the other of the upper body 1120 and the lower body 1140 is fixed. In the present embodiment, it is described that the location of the lower body 1140 is fixed, and the upper body 1120 is moved between an opening location and an interruption location by the elevation member 1130. Here, the opening location is a location at which the upper body 1120 and the lower body 1140 are spaced apart from each other so that the treatment space 1110 is opened. The interruption location is a location at which the treatment space 1110 is closed from the outside by the lower body 1140 and the upper body 1120.

The sealing member 1160 is located between the upper body 1120 and the lower body 1140. The sealing member 1160 seals an aperture between the upper body 1120 and the lower body 1140. The sealing member 1160 may be an O-ring member 1160 having an annular ring shape. The sealing member 1160 may be fixedly coupled to an upper end of the lower body 1140.

Figure 4:
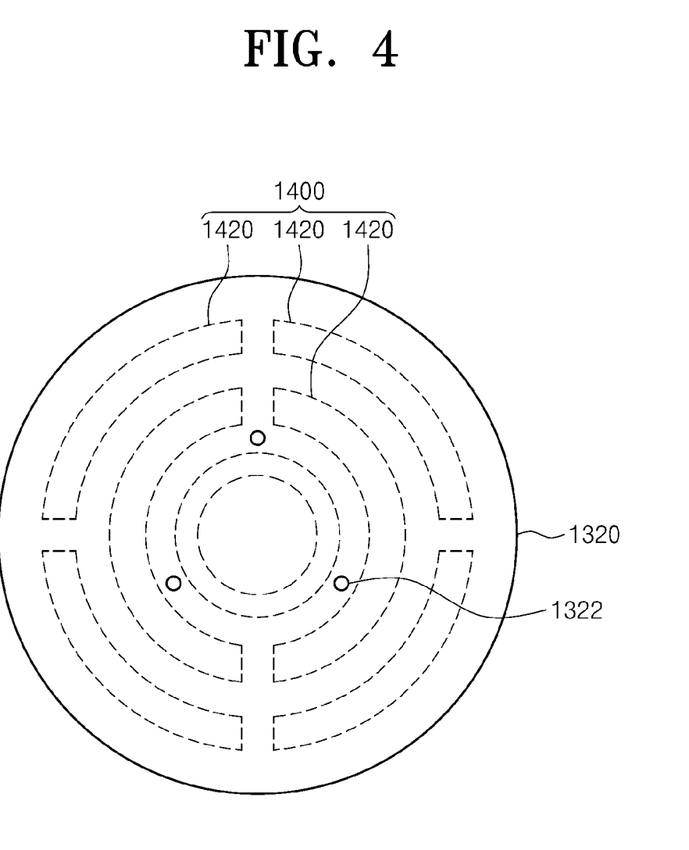
FIG. 4 is a plan view illustrating a substrate support unit of FIG. 3.

The substrate supporting unit 1300 supports the substrate W in the treatment space 1110. The substrate support unit 1300 is fixedly coupled to the lower body 1140. FIG. 4 is a plan view illustrating a substrate support unit of FIG. 3. Referring to FIG. 4, the substrate support member 1300 includes a support plate 1320 and a lift pin 1340. The support plate 1320 is provided to have a circular plate shape. An upper surface of the support plate 1320 functions as a support surface that supports the substrate W. The support surface has a diameter that is larger than that of the substrate W. A plurality of pin holes 1322 are formed on the support surface. The pin holes 1322 are located in different areas of the support surface. When viewed from the top, the pin holes 1322 are arranged to surround the center of the support surface. The pin holes 1322 are arranged to be spaced apart from each other along a circumferential direction. The pin holes 1322 are spaced apart from each other at the same interval. A lift pin 1340 is provided in each of the pin holes 1322. The lift pin 1340 may be moved upwards and downwards such that an upper end of the lift pin 1340 protrudes from the pin hole 1322 or is inserted into the pin hole 1322. The lift pin 1340 raises the substrate W from the support plate 1320, or seats the substrate W on the support plate 1320. For example, three pin holes 1322 may be provided. The support plate 1320 may be formed of a material including aluminum nitride (AlN).

The heating member 1400 heats the substrate W positioned on the substrate 1320. The heating member 1400 is located below the substrate W positioned on the support plate 1320. The heating member 1400 includes a plurality of heaters 1420. The heaters 1420 are located in the support plate 1320. The heaters 1420 are located on the same plane. For example, the heater 1420 may be a heating wire.

Optionally, the heaters 1420 may be pattern through printing. The heaters 1420 are located on the bottom surface of the support plate 1320. The heaters 1420 heat different areas of the support surface. When viewed from the top, the areas of the support plate 1320 corresponding to the heaters 1420 may be provided as heating zones. The temperatures of the heaters 1420 may be independently adjusted. For example, fifteen heating zones may be provided.

The guide unit 1500 guides a flow direction of the currents introduced into the treatment space 1110. Further, the guide unit 1500 functions as an exhaust unit 1500 that exhausts an atmosphere of the treatment space 1110. The guide unit 1500 includes an exhaust pipe 1530, a guide plate 1540, and a driving member 1580.

The exhaust pipe 1530 has a pipe shape that faces a vertical direction that is perpendicular to the lengthwise direction thereof. The exhaustion pipe 1530 is located to pass through an upper wall of the upper body 1120. According to an example, the exhaust pipe 1530 may be located to be inserted into the central hole 1122. That is, a lower end of the exhaust pipe 1530 is located in the treatment space 1110, and an upper end of the exhaust pipe 1530 is located outside the treatment space 1110. A pressure reducing member 1560 is connected to an upper end of the exhaust pipe 1530. The pressure reducing member 1560 reduces a pressure of the exhaustion pipe 1530.

Accordingly, the atmosphere of the treatment space 1110 is exhausted sequentially via a vent hole 1542 and the exhaust pipe 1530.

The guide plate 1540 has a plate shape having a vent hole 1542 at the center thereof. The guide plate 1540 has a circular plate shape extending from a lower end of the exhaust pipe 1530. The guide plate 1540 is fixedly coupled to the exhaust pipe 1530 such that the interiors of the vent hole 1542 and the exhaust pipe 1530 are communicated with each other. The guide plate 1540 is located above the support plate 1320 to face the support surface of the support plate 1320. The guide plate 1540 may have an area that is the same as or larger than that of the substrate W. The guide plate 1540 is located above the lower body 1140. According to an example, the guide plate 1540 may be located at a height corresponding to the upper body 1120. The guide plate 1540 faces the peripheral hole 1124, and has a diameter that is spaced apart from an inner surface of the upper body 1120. Accordingly, an aperture is generated between a side end of the guide plate 1540 and an inner surface of the upper body 1120, and the aperture is provided as a flow path, through which the air currents introduced through the peripheral hole 1124 is supplied to the substrate W.

The driving member 1580 is located outside the chamber 1110. The driving member 1580 provides a driving force to the exhaust pipe 1530 above the upper body 1120. The exhaust pipe 1530 and the guide plate 1540 may be moved upwards and downwards by the driving force provided by the driving member 1580. According to an example, the guide plate 1540 may be lowered when the substrate W is lifted, and may be lifted when the substrate W is lowered.

Figure 5:
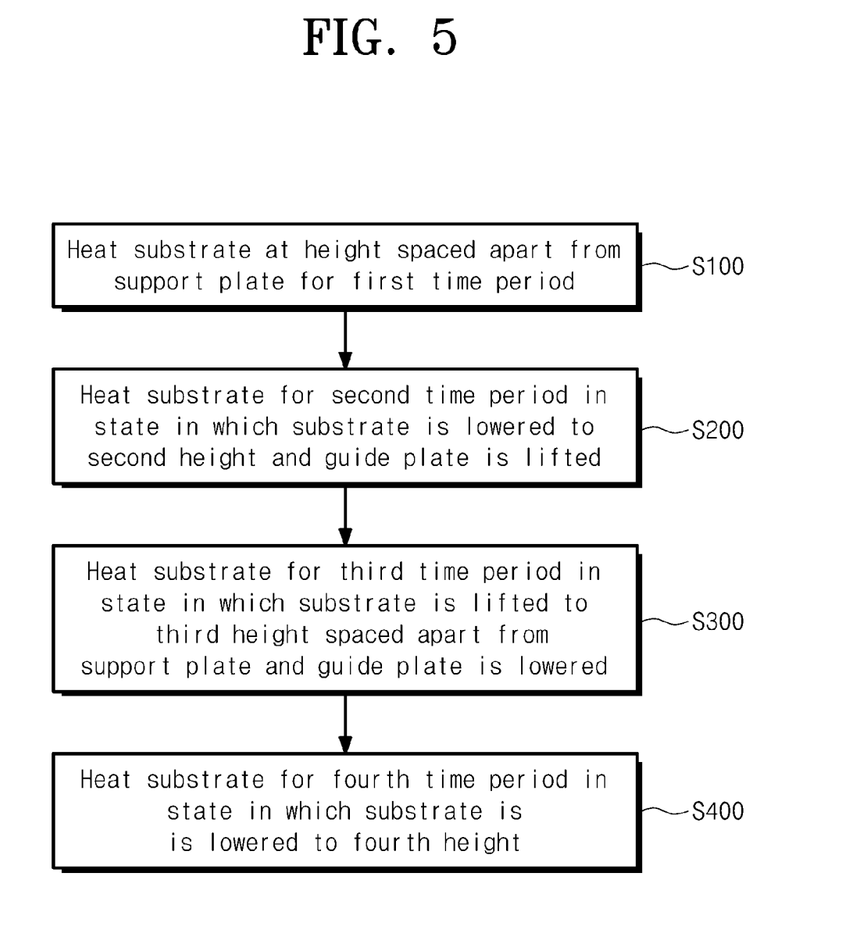
FIG. 5 is a flowchart illustrating a process of treating a substrate by using the substrate treating apparatus of FIG. 3.
Figure 6:
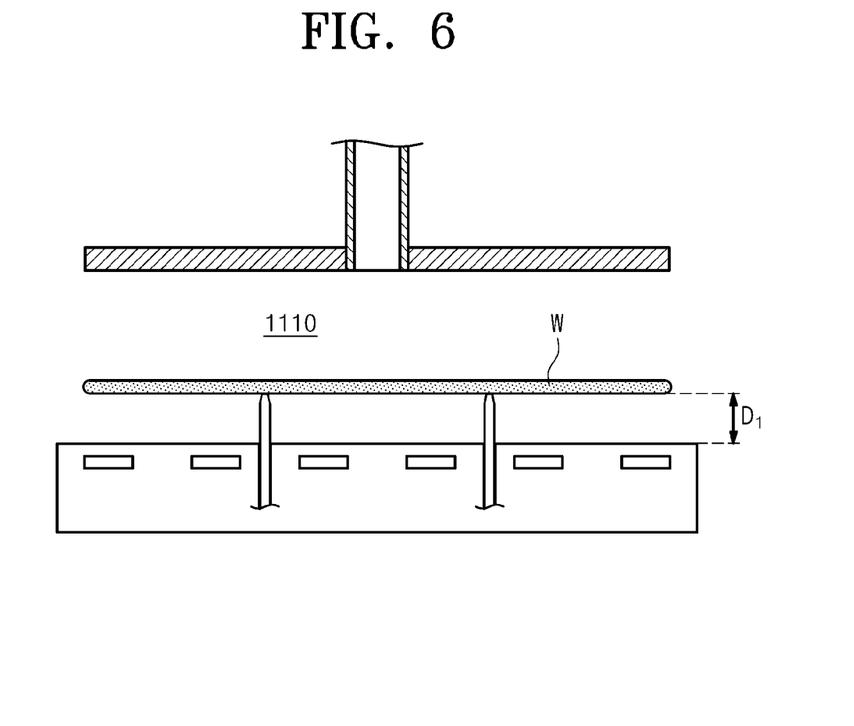
FIGS. 6 to 9 are views illustrating a process of treating a substrate by using the apparatus of FIG. 3.

The controller 1900 controls the lift pin 1340 and the driving member 1580 such that the first treatment operation S100, the second treatment operation S200, the third treatment operation S300, and the fourth treatment operation S400 are sequentially performed.

The first treatment operation S100 is an operation of heating the substrate W at a first height D1 that is spaced apart from the support plate 1320. The second treatment operation S200 is an operation of lowering the substrate W such that the substrate W is located at a second height D2 and heating the substrate W. The third treatment operation S300 is an operation of lifting the substrate W to a third height D3 that is spaced apart from the support plate 1320 and heating the substrate W. The fourth treatment operation S400 is an operation of lowering the substrate W such that the substrate W is located at a fourth height D4 and heating the substrate W.

The substrate W is elevated to the first height D1, the second height D2, the third height D3, and the fourth height D4 by the lift pin 1340. Here, the first height D1 and the third height D3 are heights at which the substrate W is spaced apart from the support plate 1320, and the second height D2 and the fourth height D4 are heights at which the substrate W is positioned on the support plate 1320. According to an embodiment, the first height D1 and the third height D3 may be the same height. Further, the controller 1900 may control the driving member 1580 to lower the guide plate 1540 when the substrate W is lifted, and to lift the guide plate 1540 when the substrate W is lowered.

Next, a process for treating a substrate W by using the aforementioned substrate treating apparatus will be described. FIG. 5 is a flowchart illustrating a process of treating a substrate by using the substrate treating apparatus of FIG. 3. FIGS. 6 to 9 are views illustrating a process of treating a substrate by using the apparatus of FIG. 3. Referring to FIGS. 5 to 9, the substrate W is delivered to the lift pin 1340 located at a lifting location by the transportation unit 240. The lift pin 1340 is located such that the substrate W is located at the first height D1. Then, the guide plate 1540 is fixed to a proper location. The chamber is moved to the interruption location and the first treatment operation S100 of the substrate W is performed. The first treatment operation S100 is performed for a first time period. For example, the first time period may be 30 seconds or a time period that is close to 30 seconds. If the first treatment operation S100 is completed, the second treatment operation S200 is performed.

Figure 7:
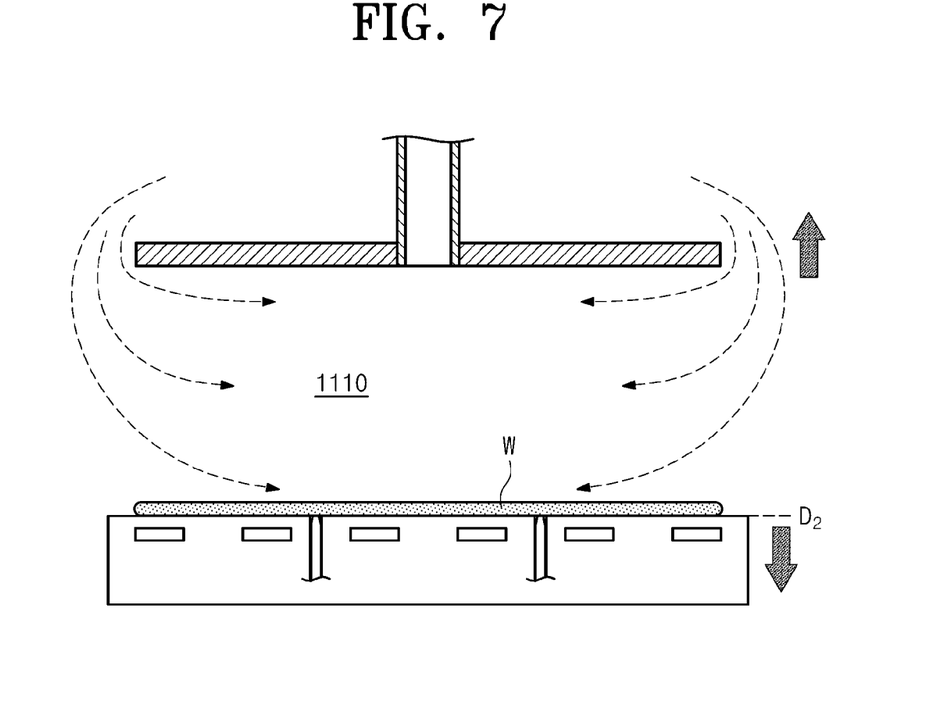

In the second treatment operation S200, the lift pin 1340 is lowered such that the substrate W is moved to the second height and the substrate W is heated. Then, the guide plate 1540 is lifted to a location that is higher than the proper location. For example, the substrate W may be lowered to be positioned on the support plate 1320. The second treatment operation S200 is performed for a second time period. The second time period is a time period that is shorter than the first time period. For example, the second time period may be 1 second. If the second treatment operation S200 is completed, the third treatment operation S300 is performed.

Figure 8:
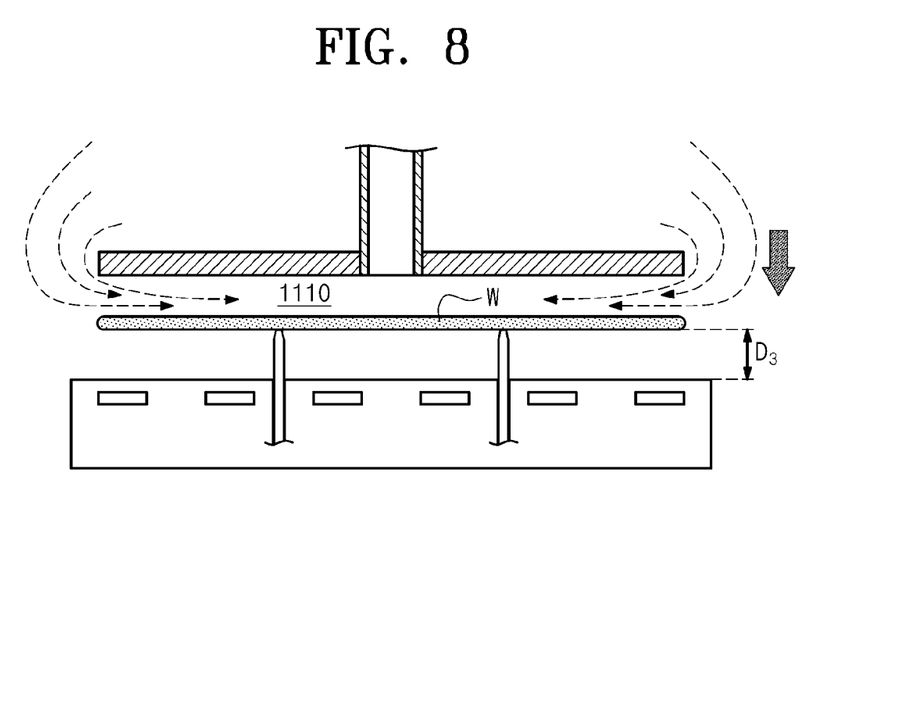

In the third treatment operation S300, the lift pin 1340 is lifted such that the substrate W is moved to the third height and the substrate W is heated. Then, the guide plate 1540 is lowered to the proper location or a location that is lower than the proper location. The third treatment operation S300 is performed for a third time period. The third time period may be a time period that is shorter than the first time period and longer than the second time period. For example, the third time period may be 10 seconds or a time period that is close to 10 seconds. If the third treatment operation S300 is completed, the fourth treatment operation S400 is performed.

Figure 9:
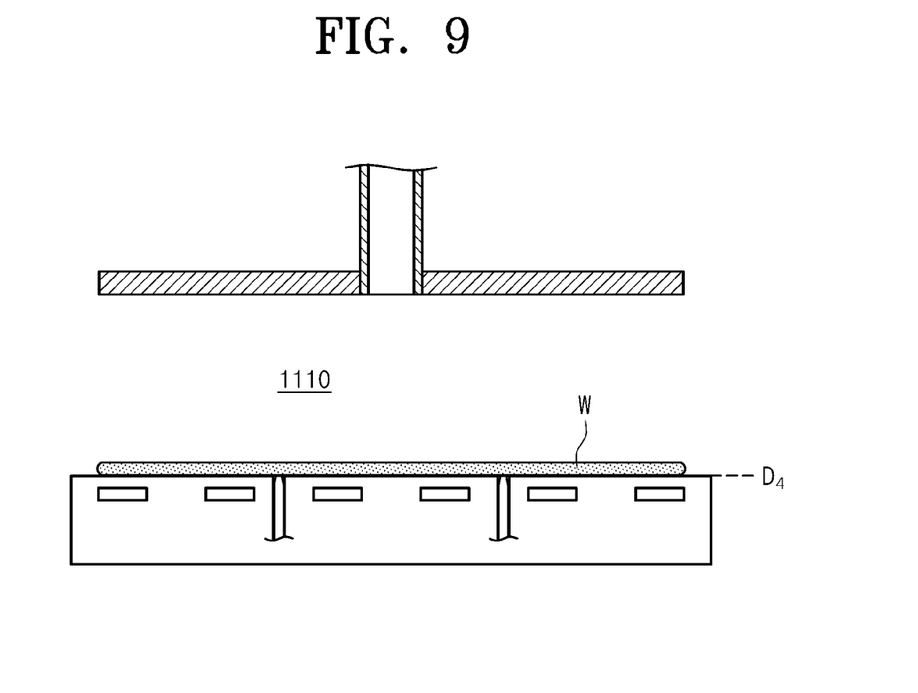

In the fourth treatment operation S400, the lift pin 1340 is lowered such that the substrate W is moved to the fourth height and the substrate W is heated. Then, the guide plate 1540 is fixed to the proper location. The fourth treatment operation S400 is performed for a fourth time period. The fourth time period may be a time period that is longer than the first time period, the second time period, and the third time period.

According to the embodiment, before the fourth treatment operation S400 is performed, the second treatment operation S200 of increasing an interval between the substrate W and the guide plate 1540 is performed such that a pressure of the treatment space 1110 becomes lower. Accordingly, the flow speed of the air currents in the treatment space 1110 is reduced, and a temperature difference between the central area and the peripheral area of the substrate W is minimized.

Further, before the fourth treatment operation S400 is performed, the third treatment operation S300 of decreasing an interval between the substrate W and the guide plate 1540 is performed such that a pressure of the treatment space 1110 becomes higher. Accordingly, the flow speed of the air currents in the treatment space increases. This may promptly exhaust organic materials on the liquid film.

According to the embodiment of the inventive concept, the pressure of the treatment space may be decreased by increasing the interval between the substrate and the guide plate, and the temperature difference between the central area and the peripheral area of the substrate may be minimized by reducing the flow speed of the air currents in the treatment space.

Further, according to the embodiment of the inventive concept, the pressure of the treatment space may be increased by decreasing the interval between the substrate and the guide plate and the organic materials on the liquid film may be promptly exhausted by increasing the flow speed of the air currents in the treatment space.

The above description is a simple exemplification of the technical spirit of the inventive concept, and the inventive concept may be variously corrected and modified by those skilled in the art to which the inventive concept pertains without departing from the essential features of the inventive concept. Therefore, the disclosed embodiments of the inventive concept do not limit the technical spirit of the inventive concept but are illustrative, and the scope of the technical spirit of the inventive concept is not limited by the embodiments of the inventive concept. The scope of the inventive concept should be construed by the claims, and it will be understood that all the technical spirits within the equivalent range fall within the scope of the inventive concept.

What is claimed is:

1. A method for treating a substrate, the method comprising:
    a first treatment operation of spacing a substrate apart from a support plate provided with a heater to a first height in a state in which a treatment space, in which the substrate is treated, is closed and heating the substrate;
    a second treatment operation of, after the first treatment operation, lowering the substrate such that the substrate is located at a second height and heating the substrate;
    a third treatment operation of, after the second treatment operation, lifting the substrate such that the substrate is spaced apart from the support plate to be located at a third height and heating the substrate; and
    a fourth treatment operation of, after the third treatment operation, lowering the substrate such that the substrate is located at a fourth height and heating the substrate.

2. The method of claim 1, wherein the second height and the fourth height are locations at which the substrate is positioned on the support plate.

3. The method of claim 2, wherein the first height and the third height are the same height.

4. The method of claim 3, wherein the first treatment operation is performed for a first time period, the second treatment operation is performed for a second time period, the third treatment operation is performed for a third time period, the fourth treatment operation is performed for a fourth time period, and each of the second time period and the third time period is shorter than the first time period or the fourth time period.

5. The method of claim 4, wherein the second time period is shorter than the third time period.

6. The method of claim 5, wherein the fourth time period is longer than the first time period.

7. The method of claim 3, wherein the treating of the substrate includes a baking process of heating the substrate, to which a photosensitive liquid is applied.

8. The method of claim 2, wherein the treatment space is provided with a guide plate located above the support plate to face the support plate and configured to guide air currents in the treatment space, and wherein the height of the guide plate is different in at least two of the first treatment operation, the second treatment operation, the third treatment operation, and the fourth treatment operation.

9. The method of claim 8, wherein the guide plate is lowered when the substrate is lifted and the guide plate is lifted when the substrate is lowered.

10. A substrate treating apparatus comprising:
a chamber having a treatment space in the interior thereof;
a support plate located in the treatment space and an upper surface of which is provided as a support surface that supports the substrate;
a heater provided in the support plate and configured to heat the substrate;
a lift pin being movable between a lowering location at which an upper end of the lift pin is located below the support surface and a lifting location at which the upper end of the lift pin protrudes through an upper side of the support surface; and
a controller configured to control the lift pin,
wherein the controller controls the lift pin to sequentially perform a first treatment operation of heating the substrate at a first height by which the substrate is spaced apart from the support plate, a second treatment operation of lowering the substrate such that the substrate is located at a second height and heating the substrate, a third treatment operation of lifting the substrate to a third height at which the substrate is spaced apart from the support plate and heating the substrate; and a fourth treatment operation of lowering the substrate such that the substrate is located at a fourth height and heating the substrate.

11. The substrate treating apparatus of claim 10, wherein each of the second height and the fourth height are locations at which the substrate is positioned on the support plate, and the first height and the third height are the same height.

12. The substrate treating apparatus of claim 11, wherein the first treatment operation is performed for a first time period, the second treatment operation is performed for a second time period, the third treatment operation is performed for a third time period, the fourth treatment operation is performed for a fourth time period, and each of the second time period and the third time period is shorter than the first time period or the fourth time period.

13. The substrate treating apparatus of claim 12, wherein the second time period is shorter than the third time period.

14. The substrate treating apparatus of claim 11, further comprising:
a guide plate located above the support plate to face the support plate in the treatment space and configured to guide air currents in the treatment space,
wherein the controller controls the guide plate such that the height of the guide plate is different in at least two of the first treatment operation, the second treatment operation, the third treatment operation, and the fourth treatment operation.

15. The substrate treating apparatus of claim 14, wherein the controller lowers the guide plate when the substrate is lifted and lifts the guide plate when the substrate is lowered.

* * * * *